United States Patent
Bucksch

(10) Patent No.: US 7,323,861 B2
(45) Date of Patent: Jan. 29, 2008

(54) CONTACT PLATE FOR USE IN STANDARDIZING TESTER CHANNELS OF A TESTER SYSTEM AND A STANDARDIZATION SYSTEM HAVING SUCH A CONTACT PLATE

(75) Inventor: Thorsten Bucksch, München (DE)

(73) Assignee: Infineon Technologies AG, Munich (DE)

( * ) Notice: Subject to any disclaimer, the term of this patent is extended or adjusted under 35 U.S.C. 154(b) by 67 days.

(21) Appl. No.: 11/065,896

(22) Filed: Feb. 25, 2005

(65) Prior Publication Data

US 2005/0200372 A1 Sep. 15, 2005

(30) Foreign Application Priority Data

Feb. 26, 2004 (DE) .................... 10 2004 009 337

(51) Int. Cl.
*G01R 31/28* (2006.01)
(52) U.S. Cl. .................... 324/158.1; 324/601
(58) Field of Classification Search .................... None
See application file for complete search history.

(56) References Cited

U.S. PATENT DOCUMENTS

| | | | | |
|---|---|---|---|---|
| 5,262,716 A | * | 11/1993 | Gregory et al. | 324/754 |
| 5,477,160 A | * | 12/1995 | Love | 324/755 |
| 6,050,829 A | * | 4/2000 | Eldridge et al. | 439/67 |
| 6,380,755 B1 | * | 4/2002 | Sato | 324/765 |
| 6,469,514 B2 | * | 10/2002 | Okayasu | 324/532 |
| 6,622,103 B1 | | 9/2003 | Miller | |
| 6,624,646 B2 | | 9/2003 | Zaiser | |
| 6,664,778 B2 | * | 12/2003 | Jacobsen et al. | 324/158.1 |
| 6,707,065 B2 | | 3/2004 | Fenner et al. | |
| 6,812,718 B1 | | 11/2004 | Chong et al. | |
| 6,847,218 B1 | | 1/2005 | Nulty et al. | |
| 6,870,359 B1 | * | 3/2005 | Sekel | 324/158.1 |
| 2002/0039022 A1 | * | 4/2002 | Yamamoto | 324/158.1 |
| 2002/0132501 A1 | | 9/2002 | Eldridge et al. | |
| 2004/0140825 A1 | * | 7/2004 | Zemer et al. | 324/758 |
| 2004/0223309 A1 | | 11/2004 | Haemer et al. | |
| 2004/0239350 A1 | | 12/2004 | Nagar et al. | |

OTHER PUBLICATIONS

U.S. Appl. No. 10/877,299, filed Jun. 25, 2004, David Suitwai Ma.
U.S. Appl. No. 10/877,649, filed Jun. 25, 2004, David Suitwai Ma.
German Patent Office Examination Report datedAug. 31, 2004.

* cited by examiner

*Primary Examiner*—Ha Tran Nguyen
*Assistant Examiner*—Richard Isla-Rodas
(74) *Attorney, Agent, or Firm*—Patterson & Sheridan, L.L.P.

(57) ABSTRACT

One embodiment of the invention provides a standardization module for use in standardizing tester channels of a tester unit using a standardization unit for making contact with contact faces which are connected to the tester channels and for standardizing the tester channels. The standardization module has a first surface on which first contact faces are arranged in such a way that contact can be made by a contact making card of the tester unit with the first contact faces in a defined fashion. The standardization module has a second surface on which second contact faces are arranged in such a way that contact can be made with the second contact faces using the standardization unit. Each of the first contact faces is respectively connected to one of the second contact faces.

14 Claims, 2 Drawing Sheets

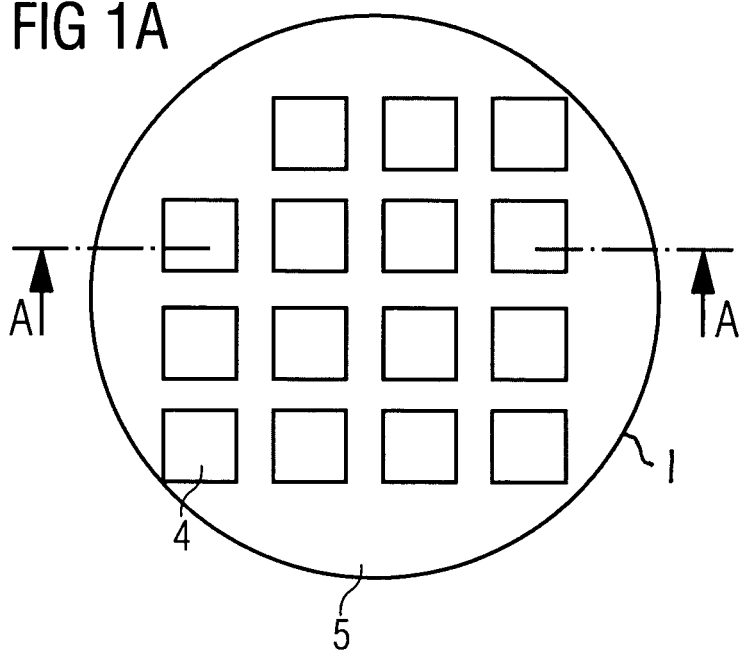
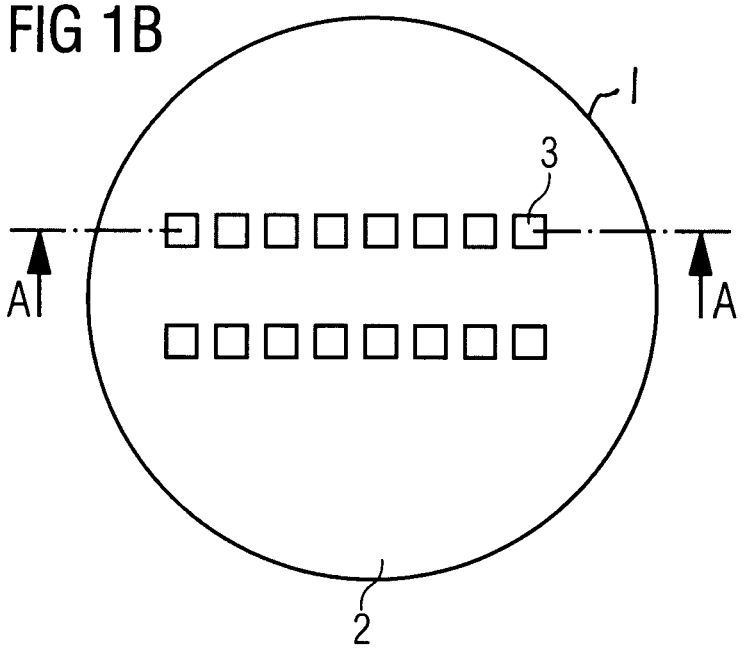
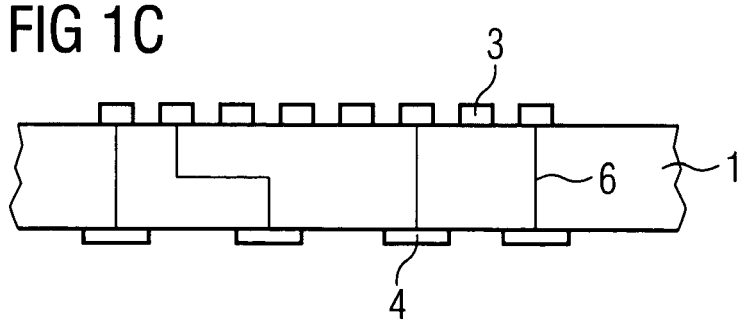

CONTACT PLATE FOR USE IN STANDARDIZING TESTER CHANNELS OF A TESTER SYSTEM AND A STANDARDIZATION SYSTEM HAVING SUCH A CONTACT PLATE

CROSS-REFERENCE TO RELATED APPLICATIONS

This application claims foreign priority benefits under 35 U.S.C. §119 to co-pending German patent application number DE 10 2004 009 337.7-35, filed 26 Feb. 2004. This related patent application is herein incorporated by reference in its entirety.

BACKGROUND OF THE INVENTION

1. Field of the Invention

The invention relates to the standardization of tester systems, in particular tester systems having a test card for making contact with integrated circuits on a wafer.

2. Description of the Related Art

When integrated components are manufactured on a wafer, their function is also tested before the wafer is sawn up. The test is typically done by fitting a test card, which usually has contact devices in the form of needles arranged in accordance with the contact faces of the integrated circuits, on the wafer in order to make contact with the contact faces. The contact making devices are connected by means of tester channels to a tester system which transmits tester signals to the integrated circuits and receives tester signals from the integrated circuits.

In order to test the integrated circuits at a high frequency, the tester channels must be standardized such that the time reference and the signal strength of the test signals which are received by the integrated circuits correspond as precisely as possible to the test signals which are generated by the tester system, and the test signals which are transmitted by the integrated circuits correspond as precisely as possible to the test signals which are received by the tester system. In order to standardize such a tester system, the tester channels are each connected to an adjustable delay unit and an adjustable signal amplifier which are set individually during the standardization process in such a way that signal transit time differences and attenuation differences on the tester channels can be compensated by setting the individual delay in the delay elements and the amplification by the signal amplifier. If the tester channels are embodied as individual line connections between the tester system and the integrated circuit, that is to say, as what is referred to as a single transmission line, the tester channel can be standardized by measuring and evaluating the voltage profile and time profile of the reflections of a test signal when the tester channel is not connected.

When two lines are used per tester channel in what is referred to as dual transmission line systems, this method of standardization is no longer possible since the lines are terminated in an adapted fashion and thus no reflection occurs at the open terminal. The dual transmission lines disconnect the lines for the signal running to the integrated circuit and the signal running back from the integrated circuit to the tester system.

In order to standardize the tester channels, a standardization robot is usually used which individually moves along the contacts of a base board and makes contact with a contact tip in order to connect them to measuring lines of the test system. The tester channels are successively adjusted in this way with respect to the signal strength and the signal transit time.

However, currently, such standardization robots can only be used for standardizing tester channels which are connected to base boards for accommodating housed integrated circuits since on such boards the dimensions of the contact points with which contact is to be made are sufficiently large and are at a sufficient distance from one another in order to have contact made with them using the contact tip.

When dual transmission line systems are used for testing integrated circuits which are located still in the unsawn state on the wafer, such a standardization robot cannot be used since the contact making devices which are located on the test card have excessively small dimensions and are too short a distance from one another in order to be able to reliably access them with the contact tip of the standardization robot. Furthermore, in the tester systems for testing integrated circuits, the test cards are permanently mounted on a wafer and are not accessible from the outside. For this reason also, the standardization robot cannot be used for standardizing the tester channels.

Even in tester systems which are to test at high frequencies and which use only single test lines as tester channels, the precision of the reflection standardization is not sufficient.

The previous procedure of testing the tester channels of a test system using a test card takes the form of additionally implementing a standardization pad in the tester device. This standardization pad can be positioned electromechanically and can be moved by means of the control of the test card to the contact making device which is to be standardized. The mechanism makes contact between the standardization pad and the contact making device of the test card. By means of this contact, the test system is connected to a reference comparator or to a reference driver in order to carry out the standardization. One disadvantage of this system is that the standardization pad has to be successively positioned on the contact making device at the tester channel to be standardized, which is time consuming and increases the risk of damage to the contact making devices.

Therefore, there is a need to provide for the standardization of a tester system which may be easily and reliably standardized using a test card for testing integrated circuits on an unsawn wafer.

SUMMARY OF THE INVENTION

According to a first aspect of the present invention, a standardization module is provided for use in standardizing tester channels of a tester unit using a standardization unit for making contact with contact faces which are connected to the tester channels and for standardizing the tester channels. The standardization module has a first surface on which first contact faces are arranged in such a way that contact can be made with the first contact faces in a defined fashion by a contact making card of the tester unit. The standardization module also has a second surface on which second contact faces are arranged in such a way that contact can be made with the second contact faces using the standardization unit. In each case, one of the first contact faces is connected to one of the second contact faces.

The standardization module according to one embodiment of the invention provides the possibility of adapting a standardization unit to a test system with a contact forming card for testing integrated circuits on a wafer. For this purpose, the standardization module makes available, on the one hand, contact faces with which contact can be made by means of the standardization unit. The standardization module also has second contact faces for making contact with the contact making devices of the contact making card of the tester unit. The contact faces for making contact by means of the standardization unit and the contact faces for making contact with the contact making devices of the contact making card are connected to one another in such a way that contact can be made with each of the tester channels of the tester unit by means of the contact faces with which contact can be made by means of the standardization unit. As a result, it is possible to standardize or calibrate each of the tester channels using the standardization unit. The standardization module according to one embodiment of the invention therefore constitutes a simple possible way of using a standardization unit which is only suitable for making contact with large contact points and for standardizing the tester channels which are connected thereto, also for standardizing tester channels of a tester unit with a contact making card for making contact with integrated circuits on a wafer.

The first contact faces may have an arrangement, size and distances with respect to one another which correspond to an arrangement of contact making devices of the contact making card of the tester unit such that when the contact making card is fitted on, contact is made with all the first contact faces by the contact making devices. In particular, the arrangement of the first contact faces corresponds to the arrangement of the contact faces of the integrated circuits on a wafer, which circuits are provided for testing using the contact making card of the tester unit. In this way, it is possible for the standardization module to be connected to the contact making card in such a way that each of the contact making devices of the contact making card, and thus the tester channel which is connected thereto, can be standardized by means of the second contact faces.

The second contact faces may have an arrangement, sizes and a distance with respect to one another such that contact can be made with the second contact faces by the standardization unit to standardize one of the tester channels in each case. The second contact faces are thus selected in such a way that the standardization unit can make contact with them and can carry out a standardization method.

According to a further aspect of the present invention, a standardization system for standardizing a tester unit which has a contact making card which is connected by means of tester channels is provided. The standardization system has a standardization unit for making contact with contact faces and for standardizing the tester channels. In addition, a standardization module is provided which can be attached to the contact making card and which has a first surface on which first contact faces are arranged in such a way that contact can be made with the first contact faces in a defined fashion by the contact making card of the tester unit, and which has a second surface on which second contact faces are arranged in such a way that contact can be made with the second contact faces using the standardization unit, with one of the first contact faces being connected respectively to one of the second contact faces.

The standardization system according to one embodiment of the invention makes it possible, by means of a suitable standardization module, to use a standardization unit, which is provided for making contact with contact faces and for standardizing tester channels, to standardize tester channels of virtually any desired tester units. To do so, the first contact faces of the standardization module may be designed in a way that corresponds to the contact making card of the tester unit so that, when the standardization module is connected to the contact making card by means of the second contact faces of the standardization module, it is possible to make contact with and standardize each tester channel.

According to one embodiment, the standardization unit has a contact element which can be moved in such a way as to make contact with one or more of the second contact faces to standardize the tester channel which is connected to the respective second contact face.

According to a further aspect of the present invention, a tester system is provided having a tester unit which has a contact making card for connecting integrated circuits by means of tester channels. In addition, the tester system comprises a standardization system having a standardization unit and a standardization module. The contact making card is connected to the standardization module to standardize the tester channels so that the tester channels can be standardized by means of the second contact faces of the standardization module.

According to a further aspect of the present invention, a method is provided for standardizing a tester unit having a contact making card connected by means of tester channels, with a standardization system which comprises a standardization unit and a standardization module. The standardization module is connected to the contact making card so that contact can be made with the tester channels by means of the second contact faces of the standardization module. The standardization unit successively makes contact with the second contact faces in such a way that the tester channel of the tester unit which is respectively connected thereto can be standardized.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 1a and 1b show plan views of the two sides of a standardization module according to one embodiment of the invention;

FIG. 1c shows a cross section along the line A-A through the standardization module according to one embodiment of the invention.

DETAILED DESCRIPTION OF THE PREFERRED EMBODIMENT

Figure 2:
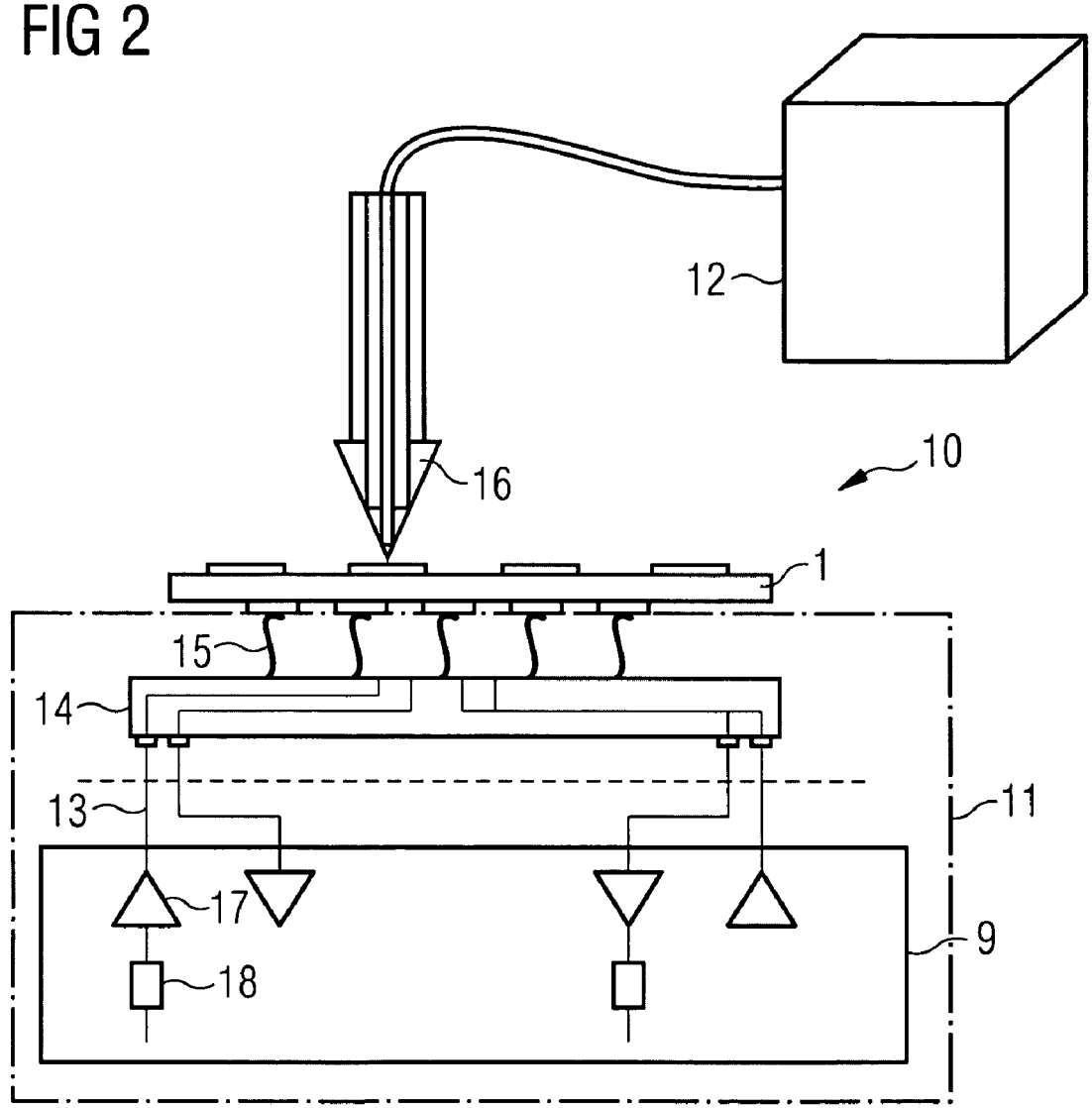
FIG. 2 is a test system with a standardization system according to an embodiment of the present invention.

FIGS. 1a and 1b illustrate two surfaces of a standardization module 1 according to one embodiment of the invention which lie opposite one another. The standardization module 1 is illustrated in cross section along the sectional line A-A in FIG. 1c. The standardization module 1 has a first surface 2 and an opposing second surface 5, as illustrated in plan views in FIG. 1b and FIG. 1a, respectively. First contact faces 3 are located on the first surface 2 and are each connected to the second contact face 4. Each of the contact faces 3 is respectively connected to one of the second contact faces 4. As shown in the cross-sectional representation in FIG. 1c, the first and second contact faces 3, 4 are connected to one another via connection lines 6 in a suitable way, for example, by means of suitable line guides in an intermediate plane. In one embodiment, the first contact faces are arranged according to a first pattern on the first surface, and the second contact faces are arranged according to a second pattern on the second surface, wherein the first and second patterns are different. Each second contact face may have a larger surface area than the respectively connected first contact face.

FIG. 2 illustrates the use of such a standardization module 1 in a test system 10 with a tester unit 11 and a standardization unit 12. The tester unit 11 has a tester 9 which is connected to a contact making card 14 of the tester unit 11 by means of tester channels 13. The contact making card 14 has contact making devices 15 in the form of contact making needles.

The contact making devices 15 are each connected to one of the tester channels 13 by means of the contact making card 14, so that test signals can be applied to the contact making device 15 by the tester 9 and test signals can be read out from an integrated circuit with which contact has been made. The tester channels 13 are embodied in the illustrated example as dual transmission line tester channels, with separate lines provided for each tester channel, for the signal which runs to the contact making card 14 and the signal which runs back from the contact making card 14 to the tester 9. The contact making devices 15 which are associated with the tester channel 13 are each terminated in an adapted fashion such that when a signal is applied to the tester channel 13, no reflection occurs.

Since the tester channels 13 are different in terms of the signal attenuation and the signal transit time, they must be standardized. This is carried out by providing for each tester channel 13 a signal amplifier 17 and a delay element 18 which can be adjusted in such a way that the corresponding test signal is applied with the same strength as and with a defined time reference to test signals at the contact-making devices 15.

The contact making card 14 may be a ceramic carrier on which the contact making needles are applied. Such a contact making card 14 usually has contact making devices 15 configured to make contact with the contact pads of one or more integrated circuits on an unsawn wafer so that the integrated circuits can be tested in a testing process. To standardize the tester channels 13, it is necessary to determine the signal transit time and the attenuation of the signal by means of the respective tester channel 13 in order to be able to adjust the signal amplification and the signal delay for the corresponding tester channel 13 in the tester 9. For this purpose, the signal transit time and the signal attenuations at the tip of the contact making devices 15 must be measured and compared with corresponding reference values. This is done using a standardization unit 12 which is connected to a measuring tip 16 which can measure the tester channels by making contact with the individual contact making devices 15, and can thus determine the corresponding settings for the signal attenuation and the signal delay for each tester channel 13. The measuring tip 16 may be moved laterally with respect to the contact making devices 15 to make contact with the corresponding tester channel 13.

Usually, the standardization units (or calibration units) 12 used for measuring tester channels 13 of tester systems are those which are used for testing housed components. In this case, the measuring tip moves the contact points onto a base board on which housed integrated components are attached and are subsequently tested in a testing process in a tester which is connected to the base board by means of tester channels. The contact points for making contact with the integrated components are usually relatively large so that the measuring tip may be easily moved using a relatively imprecise positioning method to the contact points in order to make contact. As a result, the standardization unit 12 can easily be used to standardize the tester channels 13 with such a tester system for testing housed integrated components. However, this is not possible with a tester system for making contact with integrated circuits on a wafer since the positioning accuracy of the measuring tip 16 of the standardization unit 12 is not sufficiently accurate to reliably access the contact making devices 15 of the contact making card 14.

To avoid the need to provide a more complex positioning system, the standardization module 1 may be fitted onto the contact making devices 15 of the contact making card 14 so that the contact making devices 15 make contact with the first contact faces 3 of the standardization module 1. The first contact faces 3 are, as illustrated by way of example in FIG. 1b, arranged so as to correspond to the contact pads of an integrated circuit on a wafer, for which integrated circuit the contact making card 14 is correspondingly adapted. The standardization module 1 has second contact faces 4 on its second surface, the second contact faces 4 being sufficiently large that they can be accessed and contact can be made with them by the measuring tip 16 of the standardization unit 12. Since the first contact faces 3 and the second contact faces 4 are connected to one another in such a way that one of the first contact faces 3 is electrically conductively connected to a respective one of the second contact faces 4, a signal path can be formed between the tester 9 and the standardization unit 12 by making contact with one of the second contact faces 4 by means of the measuring tip 16. By applying a standardization signal to the corresponding tester channel by means of the tester and by measuring the signal attenuation and the signal delay of the standardization signal in the standardization unit 12, the signal attenuation and the signal delay at the tip of the corresponding contact making device 15 may be determined.

The standardization module 1 may comprise any desired nonconductive materials on whose surfaces first and second electrically conductive contact faces can be applied. In one embodiment, to apply first contact faces 3 with a small size, the standardization module 1 may be formed from a ceramic material or from a multilayer ceramic in order to be able to implement corresponding line connections between the first contact faces and the second contact faces.

The standardization module 1 may have a size which is comparable with the contact making card 14 so that by attaching the standardization module 1 to the contact making card 14, by means of first contact faces 3, contact is made with all of the contact making devices 15 which are connected to the tester channels 13. This avoids the need to fit the standardization module 1 onto the contact making card 14 repeatedly in order to standardize all the tester channels 13. This also reduces wear on the contact making devices 15 and increases the efficiency during the standardization process.

While the foregoing is directed to embodiments of the present invention, other and further embodiments of the invention may be devised without departing from the basic scope thereof, and the scope thereof is determined by the claims that follow.

What is claimed is:

1. A standardization module for standardizing tester channels of a tester unit using a standardization unit, comprising:

a first surface on which a plurality of first contact faces are arranged on a first plane for connecting to the tester channels, wherein the plurality of first contact faces are configured to make direct physical contact in a planar manner, with respect to the first plane, with a plurality of contact-making needles of a contact-making card of the tester unit, the contact-making needles being configured to make direct physical contact with one or more integrated circuits formed on a wafer; and a second surface on which a plurality of second contact faces are arranged for selectable contact with a moveable measuring tip of the standardization unit; and a plurality of connections respectively connecting each one of the first contact faces to a respective one of the second contact faces wherein the first contact faces are arranged according to a first pattern on the first surface and the second contact faces are arranged according to a second pattern on the second surface, the first and second patterns being different, wherein each second contact face has a larger surface area than the respectively connected first contact face.

2. The standardization module of claim 1, wherein the arrangement of the first contact faces corresponds to an arrangement of one or more integrated circuits on a wafer which are designed to be tested utilizing the contact making card of the tester unit.

3. The standardization module of claim 1, wherein the first and the second contact faces are respectively connected such that the plurality of connections have substantially same transmission properties with respect to signal attenuation and signal delay.

4. The standardization module of claim 1, wherein the standardization module is made from one of a ceramic material and a multi-layer ceramic.

5. The standardization module of claim 1, wherein the first and the second contact faces are respectively connected such that the plurality of connections have substantially same transmission properties with respect to signal attenuation and signal delay.

6. A standardization system for standardizing tester channels of a tester unit, comprising:
a standardization unit; and
a standardization module, comprising:
a first surface on which a plurality of first contact faces are arranged in a first plane for connecting to the tester channels, wherein the plurality of first contact faces are configured to make direct physical contact in a planar manner, with respect to the first plane, with a plurality of contact-making needles of a contact-making card of the tester unit, the contact-making needles configured to make direct physical contact with one or more integrated circuits on a wafer; and
a second surface on which a plurality of second contact faces are arranged for selectable contact with the standardization unit; and
a plurality of connections respectively connecting each one of the first contact faces to a respective one of the second contact faces wherein the first contact faces are arranged according to a first pattern on the first surface and wherein the second contact faces are arranged according to a second pattern, different from the first pattern, on the second surface, and wherein each second contact face has a larger surface area than the respectively connected first contact face.

7. The standardization system of claim 6, wherein the standardization unit includes a moveable contact element for making selective contact with one or more of the second contact faces.

8. The standardization system of claim 6, wherein the standardization unit is configured for conducting measurements on housed components.

9. The standardization system of claim 6, wherein the first and the second contact faces are respectively connected such that the plurality of connections have substantially same transmission properties with respect to signal attenuation and signal delay.

10. The standardization system of claim 6, wherein the first and the second contact faces are respectively connected such that the plurality of connections have substantially same transmission properties with respect to signal attenuation and signal delay.

11. A tester system, comprising:
a tester unit comprising a contact making card having a plurality of contact making needles and a tester having a plurality of test channels connected to the plurality of contact-making needles of the contact making card, wherein the contact-making needles are configured to make direct physical contact in a planar manner, with respect to the first plane, with one or more integrated circuits on a wafer;
a standardization unit having a measuring tip; and
a standardization module, comprising:
a first surface on which a plurality of first contact faces are arranged in a first plane for connecting to the tester channels, wherein the plurality of first contact faces are configured to make direct physical contact in a planar manner with the plurality of contact-making needles of the contact-making card of the tester unit; and
a second surface on which a plurality of second contact faces are arranged for selectable contact with the measuring tip of the standardization unit; and
a plurality of connections respectively connecting each one of the first contact faces to a respective one of the second contact faces wherein the first contact faces are arranged according to a first pattern on the first surface and wherein the second contact faces are arranged according to a second pattern, different from the first pattern, on the second surface, and wherein each second contact face has a larger surface area than the respectively connected first contact face.

12. The method of claim 11, wherein the first and the second contact faces are respectively connected such that the plurality of connections have substantially same transmission properties with respect to signal attenuation and signal delay.

13. The tester system of claim 11, wherein the test channels comprise a dual transmission line system.

14. The tester system of claim 11, wherein the first and the second contact faces are respectively connected such that the plurality of connections have substantially same transmission properties with respect to signal attenuation and signal delay.

* * * * *